(12) United States Patent
Falaas et al.

(10) Patent No.: US 6,641,921 B2
(45) Date of Patent: *Nov. 4, 2003

(54) METALLIZED FILM AND DECORATIVE ARTICLES MADE THEREWITH

(75) Inventors: Dennis O. Falaas, Stillwater, MN (US); Howard C. Raschke, Rosemount, MN (US)

(73) Assignee: 3M Innovative Properties Company, St. Paul, MI (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/571,573

(22) Filed: May 15, 2000

(65) Prior Publication Data

US 2002/0110694 A1 Aug. 15, 2002

Related U.S. Application Data

(63) Continuation of application No. 08/075,297, filed on Jun. 11, 1993, now Pat. No. 6,071,621.

(51) Int. Cl.[7] .............................. B32B 3/00; B32B 27/40
(52) U.S. Cl. ...................... 428/425.8; 428/332; 428/187
(58) Field of Search ................................ 428/187, 332, 428/423.1, 423.3, 425.8, 31, 343, 344, 352

(56) References Cited

U.S. PATENT DOCUMENTS

| | | | | |
|---|---|---|---|---|
| 3,809,568 A | | 5/1974 | Askew | 117/38 |
| 3,912,842 A | | 10/1975 | Swartz | 428/172 |
| 3,953,559 A | * | 4/1976 | Weber et al. | 264/39 |
| 3,984,607 A | * | 10/1976 | Thoma et al. | 428/425 |
| 4,075,386 A | | 2/1978 | Willdorf | 428/216 |
| 4,101,698 A | | 7/1978 | Dunning | 428/31 |
| 4,196,950 A | * | 4/1980 | Churchill et al. | 312/214 |
| 4,215,170 A | | 7/1980 | Vilaprinyo Oliva | 428/328 |
| 4,287,274 A | | 9/1981 | Ibbotson et al. | 428/458 |
| 4,305,981 A | | 12/1981 | Muroi et al. | 428/31 |
| 4,349,402 A | | 9/1982 | Parker | 156/233 |
| 4,369,225 A | | 1/1983 | Manabe et al. | 428/334 |
| 4,393,120 A | | 7/1983 | Watai et al. | 428/457 |
| 4,407,871 A | | 10/1983 | Eisfeller | |
| 4,431,711 A | | 2/1984 | Eisfeller | 428/31 |
| 4,446,179 A | | 5/1984 | Waugh | 428/31 |
| 4,451,525 A | * | 5/1984 | Kawazoe et al. | 428/213 |
| 4,556,588 A | | 12/1985 | Rockwood | 428/13 |
| 4,686,141 A | | 8/1987 | Burns et al. | 428/344 |
| 4,719,132 A | | 1/1988 | Porter, Jr. | 428/457 |
| 4,810,540 A | | 3/1989 | Ellison et al. | 428/31 |
| 4,822,685 A | * | 4/1989 | Perez et al. | 428/423.3 |
| 4,877,657 A | | 10/1989 | Yaver | 428/31 |
| 4,911,811 A | * | 3/1990 | Mullaney, Jr. | 204/192.14 |
| 4,971,841 A | | 11/1990 | Panush et al. | 428/457 |
| 5,164,245 A | | 11/1992 | Suzuki | 428/201 |
| 5,215,811 A | | 6/1993 | Reafler et al. | 428/212 |
| 5,225,267 A | | 7/1993 | Ochi et al. | 428/214 |
| 5,300,140 A | * | 4/1994 | Wolf et al. | 106/1.11 |

FOREIGN PATENT DOCUMENTS

| | | |
|---|---|---|
| DE | 4022737 A1 | 1/1991 |
| EP | 0 424 173 A2 | 10/1990 |
| EP | 0 465 648 A1 | 1/1992 |
| FR | 2 113 769 | 11/1970 |
| JP | 59-152845 | 8/1984 |

OTHER PUBLICATIONS

Polymer Handbook, Third Edition, Edited by J. Brandrup and E. H. Immergut, John Wiley & Sons, 1989.
Patent Abstracts of Japan, vol. 11, No. 134 (P–571) Apr. 28, 1987 (JP,A,61 273 569).

* cited by examiner

*Primary Examiner*—Holly Rickman
(74) *Attorney, Agent, or Firm*—Jean A. Lown

(57) ABSTRACT

A metallized film comprises an opaque, continuous layer of metal on an aliphatic polyurethane substrate. The polyurethane substrate displays a glass transition temperature of about 25° to 110° C. and a melting temperature greater than or equal to 200° C. Decorative articles can be made with the metallized film.

28 Claims, 1 Drawing Sheet

METALLIZED FILM AND DECORATIVE ARTICLES MADE THEREWITH

This is a continuation of application Ser. No. 08/075,297 filed Jun. 11, 1993 now U.S. Pat. No. 6,071,621.

BACKGROUND OF THE INVENTION

1. Field of the Invention

This invention relates generally to metallized films and, more particularly, to metallized polyurethane films. This invention also relates to decorative articles made with such metallized films.

2. Description of the Related Art

Metallized films, that is, films comprising a polymeric substrate on which has been deposited a layer of metal, are often employed in, for example, the automotive, furniture, stationery, interior building material, and advertising industries to provide an aesthetic or decorative enhancement to manufactured articles. Such films, in order to be commercially useful as decorative and aesthetic enhancements, should possess several characteristics.

For example, the substrate layer should be highly transparent so as not to detract from the reflective quality of the metal layer and the overall appearance of the article. The films should also exhibit good heat stability, especially when employed in the construction of outdoor signs, motor vehicles and other articles where high temperatures may be encountered. For example, the interior of a motor vehicle on a warm, sunny day in certain climates may experience temperatures in excess of 90° C.

Flexibility is another desirable quality because flexible films are more readily applied to rough or uneven surfaces and multifaceted articles having a compound geometry. In still other applications, metallized films may be embellished with printed messages, decorative patterns, or complementary, decorative, transparent, colored layers. Metallized films, in order to be commercially useful, should readily accept printing and should be susceptible to the adhesion of further decorative layers thereto. Such films should also possess excellent adhesion between the metal and substrate layers. The films should be capable of being applied in an economical manner and retain a quality appearance without developing bubbles, wrinkles, swells or the like. Once applied, the film, should remain durable and exhibit good resistance to a wide variety of weathering and environmental conditions.

Metallized films that display a bright, highly polished, highly reflective mirrorlike appearance would be especially desirable if they could be bonded to a reinforcing layer since they could be used to simulate conventional chrome plated components, such as are found on motor vehicles.

Various metallized films are presently known. For example, metallized polyester films have been commercially available for many years.

U.S. Pat. No. 5,164,245 (Suzuki) discloses a metallized multilayer film comprising a first substrate layer, a second substrate layer on the first substrate layer, and a layer of metal on the second substrate layer. The first substrate layer comprises from 0 to about 40 parts by weight poly (vinylidine fluoride) and, correspondingly, from 100 to about 60 parts by weight poly(methyl methacrylate). This patent reports that metallized acrylic films are also known.

U.S. Pat. No. 4,101,698 (Dunning et. al.) discloses a transfer laminate having a flexible transparent or translucent elastomeric layer (e.g., polyurethane) and a layer of metal bonded to the elastomeric layer in separate, microscopically discontinuous planar quantities of high reflectivity. The metal layer forms an apparent visually continuous reflective surface.

SUMMARY OF THE INVENTION

This invention relates to metallized films that comprise an opaque, continuous layer of metal in direct contact with an aliphatic polyurethane substrate. The polyurethane substrate displays a glass transition temperature of about 25 to 110° C. and a melting temperature greater than or equal to 200° C. The metal layer may be tin, chromium, nickel, stainless steel, copper, aluminum, indium, gold, silver, or alloys thereof.

The polyurethane substrate may be derived from an aqueous urethane dispersion and may advantageously include a small amount of a crosslinking agent to desirably shift or provide the the glass transition temperature and/or to shift the melting temperature.

Other optional, though highly desired, layers that may form a part of the metallized film include a primer for improving the adhesion between the metal layer and a subsequent surface. The metallized films may also include a color layer on the polyurethane substrate and a protective clear coat layer on the color layer.

Various decorative articles including multifaceted articles having a compound geometry may be made using the metallized films of the invention. The metallized film may be placed in a conventional vacuum forming mold and a polymeric reinforcing layer may be added thereto. Attachment of the resulting decorative article to a subsequent surface may be facilitated by the use of an adhesive on the reinforcing layer.

Decorative articles made with the metallized films of the invention simulate the appearance of conventional chrome plated parts.

BRIEF DESCRIPTION OF THE DRAWINGS

The invention will be more fully appreciated with reference to the following drawings in which similar reference numerals designate like or analogous components throughout and in which.

DETAILED DESCRIPTION OF THE PREFERRED EMBODIMENTS

Figure 1:
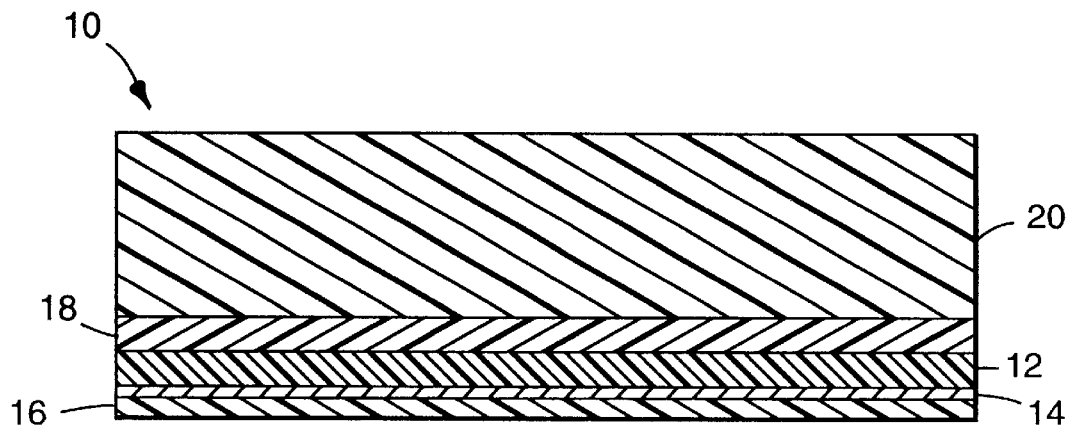
FIG. 1 is an enlarged cross-sectional view of a metallized film according the invention.

Turning now to the drawings, FIG. 1 is an enlarged cross-sectional view of a metallized film 10 according to the invention. Film 10 comprises a substrate 12 that comprises (and more preferably consists essentially of) a polyurethane material upon which has been deposited a continuous, opaque layer of metal 14. By "film" is meant a structure that is substantially, longer, wider, or both longer and wider than it is thick as well as being flexible. The polyurethane substrate should be sufficiently transparent or translucent so as to permit metal layer 14 to be viewed therethrough, especially when the metal layer provides a decorative feature.

Useful polyurethane substrates are derived from aqueous dispersions of aliphatic urethane resins, display a glass transition temperature of about 25° to 110° C., and exhibit a melting temperature greater than or equal to 200° C. The glass transition temperature and melting temperature are determined by thermal mechanical analysis using the test apparatus set-up described in ASTM D1525-87, "Standard Test Method for Vicat Softening Temperature of Plastics," although Vicat softening temperature is not measured. More specifically, a substrate sample approximately 2 to 3 mm thick is heated from −100° C. to 250° C. at a rate of 15° C. per minute. A flat tipped penetration probe (needle) having a circular cross sectional area of 1 $mm^2$ and loaded with 5 g is used. The glass transition temperature is the region in which the first transition occurs in the thermal mechanical analysis. The melting temperature is reached when the penetration probe meets no resistance.

Examples of suitable, commercially available aqueous, aliphatic urethane dispersions include the ZENECA NEOREZ family of materials from ICI Chemicals, Inc. such as XR 9699, XR 9679, and XR 9603. Also useful is MILES BAYHDROL 121 from Miles, Inc.

In some situations, the addition of a small amount (e.g., about 2.5% or less based on the solids content of the urethane dispersion) of a crosslinking agent may be advantageous in shifting or providing the glass transition temperature and/or the melting temperature of the resulting polyurethane to the desired range. Useful crosslinking agents include diaziridines, such as NEOCRYL CX-100, available from ICI Chemicals, Inc. Another useful additive is a coalescing solvent such as butyl carbitol. The polyurethane substrate may also include conventional colorants such as pigments, dyes and inks for providing a colored or tinted appearance to the substrate. Ultraviolet radiation stabilizers may also be incorporated depending on the ultimate application of the metallized film.

The polyurethane substrate typically has a thickness of about 20 to 28 microns ($\mu$m). If the substrate is too thin, it may not readily stretch or conform to articles having a compound shape. On the other hand, if the substrate is too thick, it may be difficult to form.

Continuous, opaque metal layer 14 has a highly reflective, highly polished, mirrorlike appearance. By "continuous" it is meant that metal layer 14 forms a substantially uninterrupted layer on the polyurethane substrate as opposed to a field of closely spaced dots or other separate segments. By "opaque" it is meant that metal layer 14 can not be readily seen through under normal use conditions. A typical metal density would be about 0.03 mg/$cm^2$. Virtually any ductile metal may be used to provide layer 14 although tin, chromium, nickel, stainless steel, copper, aluminum, indium, gold, silver, and alloys thereof are particularly preferred.

Metallized film 10 may optionally include a primer layer 16 for promoting adhesion between metal layer 14 and any subsequently provided reinforcement or backing layer, such as layer 22 shown in FIG. 2. The primer layer may be provided by any hydroxy functional vinyl resin (e.g., VAGH from Union Carbide Corp.), any carboxyl functional resin (e.g., VMCH from Union Carbide Corp.), or any amine functional resin. Polyamide primer layers are also useful such as MACROMELT 6240 from Henkel. The primer layer is typically about 6 to 13 $\mu$m thick. Metal layer 14 is in direct contact with the polyurethane substrate. By "direct contact" it is meant that there are no intervening tie layers or stabilizing layers.

Other optional layers include color layer 18 which may be supplemented with an overlying, protective clear coat layer 20. Color layer 18 is visible though clear coat layer 20 and provides color to film 10 by the incorporation into layer 16 of one or more of the following color agents: pigments (organic or inorganic), dyes, inks, mica, glass particles, glass beads, etc. A typical composition for color layer 18 is an acrylic/vinyl resin binder containing a pigment. Clear coat layer 20 provides abrasion resistance and environmental weathering resistance to color layer 18 and is typically provided by a solvent-based polyurethane.

Figure 2:
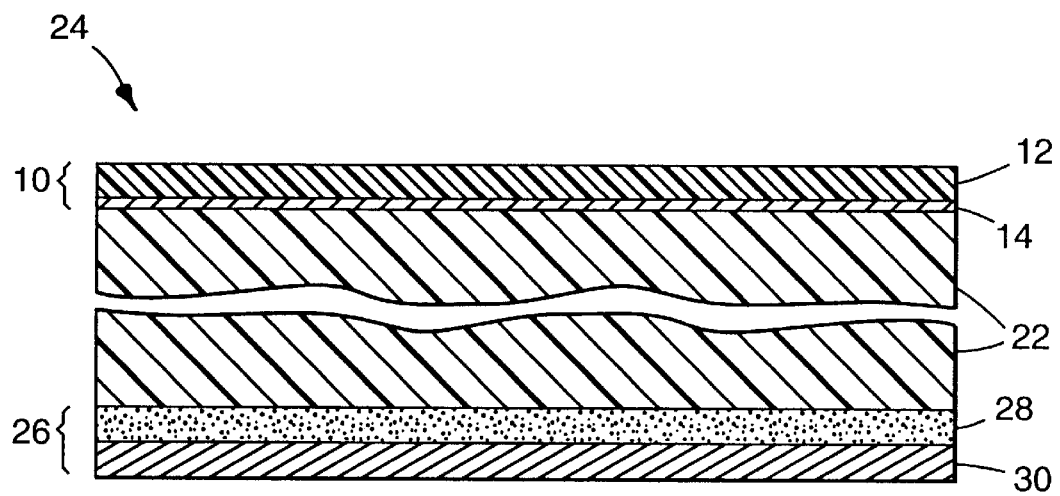
FIG. 2 is an enlarged cross-sectional view of an article incorporating a metallized film according to the invention.

Turning now to FIG. 2, film 10 comprising polyurethane substrate 12 and metal layer 14 is secured to a polymeric reinforcing or backing layer 22 which is useful in providing a decorative article 24 and the like for subsequent attachment to various surfaces. Reinforcing or backing layer 22 may be provided a wide variety of materials such as urethanes, acrylonitrile-butadiene-styrenes, thermoplastic polyolefins, and the like. In general, virtually any thermoplastic molding compound may be used.

To facilitate the attachment of decorative article 24 to a subsequent surface, the article may be provided with an attachment system 26. The attachment system may be provided by, for example, an acrylic, pressure-sensitive adhesive foam tape 28 that is temporarily protected by a removable release liner 30, such as a silicone treated paper or polyester film.

Metallized film 10 may be readily and easily formed. For example, the aqueous urethane dispersion for providing polyurethane substrate 12 may be cast onto a suitable release liner such as a release coated polyester film. The cast urethane dispersion is then dried to remove water. The polyurethane coated release liner is then vapor coated to opacity with the desired metal using conventional vapor coating techniques. Optional primer layer 16 may then be added, if desired, by coating, hot lamination, or the like, depending on the nature of the primer layer.

If metalized polyurethane film 10 is to be subsequently formed into a decorative article, the polyester release liner is removed and the metallized film is placed in a conventional vacuum forming mold with the metallized surface facing away from the mold surface. Typically, the mold is heated to about 52° C. and a vacuum sufficient to enable the film to conform to the contoured mold cavity is applied. The polyurethane substrates used in the invention are flexible, stretchable, and readily vacuum formed into shapes having a compound geometry.

Optional reinforcing or backing layer 22 may be used to backfill the mold by being deposited into the mold cavity against the metallized surface of the film. Attachment system 26 may be applied using, for example, heated nip rollers in the case of foam tape. The reinforcing layer is typically oven cured followed by any optional decorating such as the casting and curing of color layer 18 and protective clear coat 20. The resulting decorative articles display a highly reflective, highly polished, mirrorlike finish.

The invention will be more fully appreciated with reference to the following non-limiting examples.

EXAMPLES 1 to 11

Examples 1 to 11 illustrate the use of different aliphatic urethane dispersions to provide polyurethane substrate 12 as well as the effect of including or excluding a crosslinking agent. Table 1 below indicates various commercially available aliphatic urethane dispersions that were used in forming the polyurethane substrate and the presence or absence of a crosslinking agent. The "% Crosslinking Agent" refers to the percent of NEOCRYL CX-100 that was added based on the total solids content of the urethane dispersion. In each example, the urethane dispersion also included 10% butyl carbitol (based on the solids content of the urethane dispersion).

The compositions of Table 1 (including butyl carbitol) were cast onto release coated polyester films and dried for 2 minutes at about 93° C. and then for 3 minutes at about 149° C. so as to provide approximately 25 µm thick polyurethane substrates. The polyurethane substrates with the polyester film were then placed in a DENTON Vacuum DV-515 bell jar vapor coating machine and vapor coated to opacity with tin metal (about 0.2 mg/cm² metal density).

After vapor coating, the polyester film was removed and the metalized polyurethane substrate was placed in an approximately 52° C. conventional vacuum forming mold and vacuum drawn into small decorative parts having a pentagonal shape, a compound geometry, a diameter of approximately 2.54 cm, and a thickness of about 0.25 cm.

A reinforcing layer provided by a two-part polyurethane casting resin that comprised equal equivalents of LEXOREZ 5901-300 polyester polyol (available from Inolex Chemical Co.) (to which was added a trace amount of dibutyl tin dilaurate catalyst) and DESMODUR N-100 polyisocyanate (available from Miles, Inc.) was poured into the mold cavity and in contact with the layer of tin metal. An acrylic pressure sensitive adhesive foam tape was then laminated to the reinforcing layer.

The contents of the vacuum forming mold were heated for about 5 minutes at about 52° C. to cure the reinforcing layer. The resulting molded part was removed from the mold, trimmed, and applied to a painted steel panel with the acrylic foam tape.

Also shown in Table 1 are the glass transition temperature (Tg) and the melting temperature (Tm) (as determined by the thermal mechanical analysis procedure described more fully hereinabove), the observed results being reported to the nearest 0.1° C.

TABLE 1

| Example | Urethane Resin | % Cross-linking Agent | Tg (° C.) | Tm (° C.) |
| --- | --- | --- | --- | --- |
| 1 | ZENECA NEOREZ XR 9699 | 1 | 44.1 | 221.6 |
| 2 | ZENECA NEOREZ XR 9699 | 0 | 50.5 | 202.6 |
| 3 | ZENECA NEOREZ XR 9679 | 1 | 106.5 | 214.3 |
| 4 | MILES BAYHYDROL 110 | 0 | 47.9 | 199.1 |
| 5 | MILES BAYHYDROL 121 | 0 | N.O. | 216.1 |
| 6 | MILES BAYHYDROL 121 | 1 | 64.6 | 225.2 |
| 7 | ZENECA NEOREZ XR 9603 | 1 | 25.9 | 219.7 |
| 8 | ZENECA NEOREZ XR 9603 | 0 | 41.5 | 205.3 |
| 9 | 75% ZENECA NEOREZ XR 9699 25% MILES BAYHYDROL 121 | 1 | 34.7 | 233.7 |
| 10 | 50% ZENECA NEOREZ XR 9699 50% MILES BAYHYDROL 121 | 1 | 53.4 | 228.9 |
| 11 | 25% ZENECA NEOREZ XR 9699 75% MILES BAYHYDROL 121 | 1 | 52.6 | 229.6 |

N.O. = Not Observed

Upon removal from the vacuum forming mold, the parts of each of examples 1 to 11 displayed a bright, highly reflective, highly polished, mirrorlike appearance that simulated the look of conventional chrome plated parts. Even after seven days in a 93° C. oven and 2000 hours of accelerated xenon exposure weathering (based on SAE J1960 June 1989 "Accelerated (G-26 Type BH) Exposure of Automotive Exterior Materials Using a Controlled Irradiance Water Cooled Xenon Arc Apparatus") the parts of examples 1 to 3 and 6 to 11 did not appreciably change in appearance and were considered weatherable. The part of example 4 turned a dull gray color and the part made in example 5 lost a small amount of its original bright appearance. Consequently, examples 4 and 5 were considered unacceptable.

Table 1 illustrates the benefit of providing a polyurethane substrate having a glass transition temperature of about 25° to 110° C. and a melting temperature greater than or equal to 200° C. Comparing the results obtained for examples 5 and 6 shows the beneficial effect of including a small amount of a crosslinking agent in the polyurethane formulation. The addition of 1% of a crosslinking agent in the polyurethane formulation of example 5 resulted in a suitable substrate (example 6). Examples 9 to 11 indicate that blends of more than one urethane dispersion provide useful polyurethane substrates.

EXAMPLES 12 to 16

Examples 12 to 16 were prepared utilizing the procedure described in conjunction with example 1 and further included a primer layer on the metal layer for providing enhanced adhesion between the metal layer and the reinforcing layer. The primer of each example was an approximately 13 µm thick precast layer of MACROMELT 6240 polyamide that was hot laminated to the metal layer using a pair of nip rollers heated to 121° C. and a feed rate of about 3.05 meters per minute. The metal layer was also varied, as shown below in Table 2.

TABLE 2

| Example | Metal layer |
| --- | --- |
| 12 | Tin |
| 13 | Nickel |
| 14 | Chromium |
| 15 | Stainless Steel |
| 16 | Inconel |

Upon removal from the vacuum forming mold, each part exhibited a bright, highly reflective, highly polished, mirrorlike appearance that simulated conventional chrome plated parts. After 7 days in a 93° C. oven and 2000 hours of accelerated weathering, none of the parts appreciably changed in appearance. Table 2 indicates that various metals may be applied to the polyurethane substrate so as to form a metallized film in accordance with the invention.

EXAMPLE 17

A metallized film according to the invention was prepared by blending ZENECA NEOREZ 9699 with 2% NEOCRYL CX-100 crosslinking agent (based on the solids content of the urethane dispersion) and 10% butyl carbitol (based on the solids content of the urethane dispersion), casting on a release coated polyester film, and drying for 2 minutes at about 93° C. and then for 3 minutes at about 149° C. so as to yield an approximately 20 µm thick polyurethane substrate. The polyurethane substrate was placed in a DENTON Vacuum DV-515 bell jar vapor coating machine and was vapor coated to opacity with tin metal. A 13 µm thick MACROMELT 6240 polyamide primer layer was then hot laminated to the metal layer using a pair of 121° C. nip rollers and a 3.05 meters per minute feed rate. The primed, vapor coated polyurethane substrate was then removed from the polyester film and placed in a conventional vacuum forming mold that had been heated to approximately 54° C.

A polyurethane reinforcing layer was provided by pouring into the depression in the vacuum forming mold a mixture comprising equal equivalents of LEXOREZ 5901-300 polyester polyol (to which was added a trace amount of dibutyl tin dilaurate catalyst) and DESMODUR N-100 polyisocyanate followed by the addition of an acrylic, pressure sensitive foam adhesive tape. The reinforcing layer was cured at about 54° C. for about 5 minutes. The resulting part exhibited a bright, highly reflective, highly polished, mirrorlike appearance that simulated conventional chrome plated parts. No appreciable change in appearance was observed following 7 days in a 93° C. oven.

EXAMPLE 18

7.2g MONASTRAL YT-919D gold pigment (available from Ciba Geigy, Inc.) was ball milled with 220 grams (g) of ZENECA XR9699 aliphatic urethane dispersion and 20 g butyl carbitol for 21 hours. A small amount of this dispersion, sufficient to give a transparent yellow color, was added to a blend of 100 g ZENECA XR-9699, 10 g butyl carbitol, and 0.3 g Rohm & Haas TRITON GR-7M. This blend was cast on a release coated polyester film and dried for 5 minutes at 93° C. and then for 3 minutes at 149° C. to give an approximately 25 μm thick film. After vapor coating to capacity with tin metal, the sample was primed and formed as in example 12 to give a decorative product having a bright, highly reflective, highly polished gold appearance. The part showed no appreciable change in appearance after 7 days in a 93° C. oven and 2000 hours of accelerated weathering.

EXAMPLE 19 to 22

Examples 19 to 22 were prepared to evaluate the utility of alternative substrate materials. In each case, the procedure described in conjunction with example 17 was followed except using a substrate material selected according to Table 3 below.

TABLE 3

| Example | Substrate |
| --- | --- |
| 19 | Polyethylene terephthalate |
| 20 | Polyvinylidene fluoride |
| 21 | Polyvinyl chloride |
| 22 | Polybutylene terephthalate |

Examples 20 to 22 resulted in products having a hazy appearance that did not simulate conventional chromed plated parts and were considered unacceptable. Example 19, while providing a part that simulated a conventional chrome plated part, could not be readily formed in the vacuum mold and, as a result, was considered unacceptable.

Numerous variations and modifications are possible within the scope of the foregoing specification and drawings without departing from the spirit of the invention which is defined in the accompanying claims.

The embodiments for which an exclusive property or privilege is claimed are defined as follows:

1. A metallized film comprising (i) a continuous, opaque layer of metal on (ii) a transparent polyurethane substrate, said polyurethane substrate having an outer surface of polyurethane, and (iii) a release liner temporarily attached to the outer surface of the polyurethane.

2. The metallized film according to claim 1, wherein said metal is selected from the group consisting of tin, chromium, nickel, stainless steel, copper, aluminum, indium, gold, silver, and alloys thereof.

3. The metallized film according to claim 1, wherein said metal is indium or an alloy thereof.

4. The metallized film according to claim 1, wherein said metal is tin or an alloy thereof.

5. The metallized film according to claim 1, wherein said polyurethane substrate includes a crosslinking agent.

6. The metallized film according to claim 1, further comprising a protective clear coat layer and color layer wherein said layer of metal is visible through said protective clear coat layer, said color layer, and said polyurethane substrate.

7. The metallized film according to claim 1, further comprising a primer layer on said layer of metal for improving adhesion to said layer of metal.

8. The metallized film according to claim 1, wherein said metal is in direct contact with said polyurethane substrate.

9. The metallized film according to claim 1, further comprising an attachment system to facilitate the attachment of said film to a subsequent surface.

10. The metallized film according to claim 9, wherein said attachment system comprises a pressure-sensitive adhesive foam tape.

11. The metallized film according to claim 1, wherein said polyurethane substrate includes colorants for providing a colored or tinted appearance to said substrate.

12. The metallized film according to claim 1, wherein said polyurethane substrate has a thickness in the range of 20.0 to 28.0 micron.

13. The metallized film according to claim 1, wherein said film accepts printing.

14. The metallized film according to claim 1 in combination with and secured to a reinforcing or backing layer so as to form a manufactured article.

15. The metallized film according to claim 14, wherein said article is operatively adapted for use in at least one of the automotive, furniture, stationery, interior building material, and advertising industries.

16. The metallized film according to claim 14, wherein said article has a surface with a compound shape and said film has been stretched so as to conform to the compound shape of said surface.

17. The metallized film according to claim 14, further comprising a primer layer on said layer of metal for improving the adhesion of said layer of metal to said reinforcing or backing layer.

18. The metallized film according to claim 14, further comprising an attachment system to facilitate the attachment of said article to a subsequent surface.

19. The metallized film according to claim 18, wherein said attachment system is an adhesive.

20. The metallized film according to claim 18, wherein said attachment system is an acrylic pressure-sensitive adhesive foam tape.

21. The metallized film according to claim 1, wherein said polyurethane substrate is transparent such that the layer of metal is viewable through the polyurethane substrate.

22. An article of manufacture comprising the metallized film of claim 1 and a base substrate permanently attached to the metallized film, wherein the metal layer is between the permanently attached base substrate and the polyurethane substrate.

23. The metallized film according to claim 1, wherein the metal layer is formed by vapor deposition.

24. An article of manufacture comprising (i) a base substrate, (ii) a continuous, opaque layer of metal, and (iii) a polyurethane substrate, said polyurethane substrate being derived from an aqueous urethane dispersion, wherein the layer of metal is positioned between the base substrate and the polyurethane substrate, and (iv) at least one component on an outer surface of the polyurethane substrate opposite the layer of metal, wherein the at least one component comprises a printed message, a decorative pattern, a color layer, a clear coat protective layer, or a combination thereof.

25. An article of manufacture comprising (i) a base substrate, (ii) a continuous, opaque layer of metal, and (iii) a polyurethane substrate, said polyurethane substrate being derived from an aqueous urethane dispersion, wherein the layer of metal is positioned between the base substrate and the polyurethane substrate, and (iv) a color layer on an outer surface of the polyurethane substrate opposite the layer of metal.

26. The article of manufacture according to claim 25, further comprising a protective clear coat layer on the color layer opposite the polyurethane substrate.

27. The article of manufacture according to claim 26, wherein the protective clear coat comprises a solvent-based polyurethane.

28. An article of manufacture comprising (i) a base substrate, (ii) a continuous, opaque layer of metal, and (iii) a polyurethane substrate, said polyurethane substrate being derived from an aqueous urethane dispersion, wherein the layer of metal is positioned between the base substrate and the polyurethane substrate, and (iv) at least one layer between the base substrate and the layer of metal, wherein the at least one layer comprises an attachment system, a reinforcing layer, or a combination thereof.

* * * * *

UNITED STATES PATENT AND TRADEMARK OFFICE
CERTIFICATE OF CORRECTION

PATENT NO. : 6,641,921 B2
DATED : November 4, 2003
INVENTOR(S) : Falaas, Dennis O.

It is certified that error appears in the above-identified patent and that said Letters Patent is hereby corrected as shown below:

<u>Title page</u>,
Item [73], Assignee, delete "MI", insert in place thereof -- MN --,
Item [56], References Cited, U.S. PATENT DOCUMENTS, delete "Dunning", insert in place thereof -- Dumming --.

<u>Column 8</u>,
Line 2, insert -- a -- following "and".
Line 2, insert -- , -- following "layer"
Line 22, delete "micron", insert in place thereof -- microns --.

Signed and Sealed this

Sixteenth Day of March, 2004

JON W. DUDAS
*Acting Director of the United States Patent and Trademark Office*